United States Patent
Chan et al.

(10) Patent No.: US 9,105,769 B2
(45) Date of Patent: Aug. 11, 2015

(54) SHALLOW JUNCTION PHOTOVOLTAIC DEVICES

(71) Applicant: INTERNATIONAL BUSINESS MACHINES CORPORATION, Armonk, NY (US)

(72) Inventors: Kevin K. Chan, Staten Island, NY (US); Bahman Hekmatshoartabari, White Plains, NY (US); Tak H. Ning, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/025,525

(22) Filed: Sep. 12, 2013

(65) Prior Publication Data

US 2015/0072467 A1    Mar. 12, 2015

(51) Int. Cl.
*H01L 21/00* (2006.01)
*H01L 31/0224* (2006.01)
*H01L 31/18* (2006.01)

(52) U.S. Cl.
CPC ........ *H01L 31/022441* (2013.01); *H01L 31/18* (2013.01)

(58) Field of Classification Search
USPC .......................................................... 438/98
See application file for complete search history.

(56) References Cited

U.S. PATENT DOCUMENTS

| | | | |
|---|---|---|---|
| 6,759,696 B2 * | 7/2004 | Huizing et al. | 257/195 |
| 6,979,589 B2 | 12/2005 | Kishimoto et al. | |
| 8,426,724 B2 | 4/2013 | Nakayashiki et al. | |

(Continued)

FOREIGN PATENT DOCUMENTS

| CN | 101699633 B | 3/2012 |
|---|---|---|
| CN | 101699633 A | 4/2013 |

(Continued)

OTHER PUBLICATIONS

Teplin et al., Mechanisms controlling the phase and dislocation density in epitaxial silicon films grown from silane below 800 C, Appl. Phys. Lett. 96, 201901 (2010).*

(Continued)

*Primary Examiner* — Reema Patel
*Assistant Examiner* — Syed Gheyas
(74) *Attorney, Agent, or Firm* — Tutunjian & Bitetto, P.C.; Louis J. Percello

(57) ABSTRACT

A method for fabricating a photovoltaic device includes forming a first contact on a crystalline substrate, by epitaxially growing a first doped layer having a doping concentration of $10^{19}$ $cm^{-3}$ or greater, a dislocation density of $10^5$ $cm^{-2}$ or smaller, a hydrogen content of 0.1 atomic percent or smaller, and a thickness configured to reduce Auger recombination in the epitaxially grown doped layer. A first passivation layer is formed on the first doped layer. A second contact is formed on the crystalline substrate on a side opposite the first contact by epitaxially growing a second doped layer having a doping concentration of $10^{19}$ $cm^{-3}$ or greater, a dislocation density of $10^5$ $cm^{-2}$ or smaller, a hydrogen content of 0.1 atomic percent or smaller and a thickness configured to reduce Auger recombination in the second epitaxially grown doped layer. A second passivation layer is formed on the second doped layer.

11 Claims, 9 Drawing Sheets

(56) References Cited

U.S. PATENT DOCUMENTS

| | | | |
|---|---|---|---|
| 2009/0211623 A1* | 8/2009 | Meier et al. | 136/246 |
| 2010/0032011 A1 | 2/2010 | Sauar | |
| 2010/0154876 A1 | 6/2010 | Camalleri et al. | |
| 2012/0211079 A1* | 8/2012 | Hekmatshoar-Tabari et al. | 136/258 |
| 2013/0065350 A1 | 3/2013 | Ravi | |

FOREIGN PATENT DOCUMENTS

| | | | |
|---|---|---|---|
| CN | 103066153 A | 4/2013 |
| JP | 11307794 A | 11/1999 |
| JP | 2000183377 A | 6/2000 |
| JP | 2000243992 A | 9/2000 |
| JP | 2009076742 A | 4/2009 |
| JP | 2136066 B2 | 6/2013 |

OTHER PUBLICATIONS

Lai et al., Low Temperature Epitaxy using Rapid Thermal Chemical Vapor Deposition (RTCVD) for Solar Cell Application, Photovoltaic Specialists Conference (PVSC), 2010 35th IEEE, pp. 001432-001435.*

Del Alamo, J., et al. "Modelling of Minority-Carrier Transport in Heavily Doped Silicon Emmiters" Solid-State Electronics. vol. 30, No. 11. Nov. 1987. Pages 1127-1136.

King, R., et al. "Studies of Diffused Boron Emitters: Saturation Current, Bandgap Narrowing, and Surface Reconbination Velocity" IEEE Transactions on Electron Devices, vol. 38. No. 6. Jun. 1991.

Lu, M., et al. "Integrated Back Contact Silicon Heterojunction Solar Cell and the Effect of Front Surface Passivation," Applied Physics Letters, Aug. 2007, vol. 91, Issue 6. (4 pages).

* cited by examiner

SHALLOW JUNCTION PHOTOVOLTAIC DEVICES

BACKGROUND

1. Technical Field

The present invention relates to photovoltaic devices, and more particularly to devices and methods with passivated shallow junctions to reduce Auger recombination effects.

2. Description of the Related Art

In conventional front-contact solar cells, junctions are formed by diffusion and typically are a few hundreds of nanometers but less than 1 micron deep. Although higher doping levels are desired for increasing the splitting of quasi-Fermi levels and thus improving an open circuit voltage of the solar cell, the doping levels are chosen below $10^{19}$ cm$^{-3}$ (typically the mid to upper $10^{18}$ cm$^{-3}$ range) to avoid excessive Auger recombination in the highly doped region.

In conventional interdigitated back-contact (IBC) solar cells, doped regions are formed by diffusion with doping levels also below $10^{19}$ cm$^{-3}$ to avoid excessive Auger recombination. In addition, at doping levels below $10^{19}$ cm$^{-3}$ considerable portions of minority carriers can reach a substrate surface, and therefore be recombined at localized contact regions where metal electrodes are in direct contact with the doped regions.

Since all IBC junctions are formed with doping levels below $10^{19}$ cm$^{-3}$, open circuit voltage ($V_{oc}$) is limited by splitting of quasi Fermi levels (determined by doping concentration). In addition, doping levels below $10^{19}$ cm$^{-3}$ do not completely shield the carriers from the substrate surface, therefore limiting the $V_{oc}$ due to recombination at localized metal contact areas. It is very difficult to form a high doping concentration especially in thin layers by conventional diffusion.

SUMMARY

A method for fabricating a photovoltaic device includes forming a first contact on a crystalline substrate, the first contact being formed by epitaxially growing a first doped layer having a doping concentration of $10^{19}$ cm$^{-3}$ or greater, a dislocation density of $10^5$ cm$^{-2}$ or smaller, a hydrogen content of 0.1 atomic percent or smaller, and a thickness configured to reduce Auger recombination in the epitaxially grown doped layer and forming a first passivation layer on the first doped layer. A second contact is formed on the crystalline substrate on a side opposite the first contact, the second contact being formed by epitaxially growing a second doped layer having a doping concentration of $10^{19}$ cm$^{-3}$ or greater, a dislocation density of $10^5$ cm$^{-2}$ or smaller, a hydrogen content of 0.1 atomic percent or smaller and a thickness configured to reduce Auger recombination in the second epitaxially grown doped layer and forming a second passivation layer on the second doped layer.

A method for forming a photovoltaic device includes forming an interdigitated back contact on a crystalline substrate having first epitaxially grown doped regions and second epitaxially grown doped regions in contact with the substrate, the first and second epitaxially grown doped regions having a doping concentration of $10^{19}$ cm$^{-3}$ or greater, a dislocation density of $10^5$ cm$^{-2}$ or smaller, a hydrogen content of 0.1 atomic percent or smaller and a thickness configured to reduce Auger recombination in the first and second epitaxially grown doped regions; and forming a passivation layer over the first and second epitaxially grown doped regions; and forming conductive electrodes over the passivation layer corresponding to the first and second epitaxially grown doped regions.

A photovoltaic device includes a first contact formed on a crystalline substrate, the first contact including a first doped crystalline layer having a doping concentration of $10^{19}$ cm$^{-3}$ or greater, a dislocation density of $10^5$ cm$^{-2}$ or smaller, a hydrogen content of 0.1 atomic percent or smaller, and a thickness configured to reduce Auger recombination in the first epitaxially grown doped layer. A first passivation layer is formed on the first doped layer. A second contact is formed on the crystalline substrate, the second contact including a second crystalline doped layer having a doping concentration of $10^{19}$ cm$^{-3}$ or greater, a dislocation density of $10^5$ cm$^{-2}$ or smaller, a hydrogen content of 0.1 atomic percent or smaller, and a thickness configured to reduce Auger recombination in the second epitaxially grown doped layer. A second passivation layer is formed on the second doped layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, photovoltaic devices are provided having junctions formed that are thin (preferably less than about 5 nm), highly doped (preferably greater than $10^{19}$ cm$^{-3}$) epitaxial (epi) layers with very low dislocation density (e.g., less than $10^5$ cm$^{-2}$) resulting in shallow junctions essentially having a depth equal to that of the epitaxial layer thickness. The very thin epitaxial layers result in low Auger recombination levels and have little or no impact on photovoltaic cell performance. In addition, due to the high doping concentration in the epi layer(s), a density of minority carriers reaching a substrate surface is reduced, and therefore a modest surface passivation is sufficient to achieve sufficiently low surface recombination levels. The thin epitaxial layers also permit short growth times, which is desirable for high manufacturing throughput.

In one embodiment, an interdigitated back-contact (IBC) photovoltaic device includes junctions comprised of thin (preferably <5 nm) highly doped (preferably >$10^{19}$ cm$^{-3}$) epitaxial layers with very low dislocation density (<$10^5$ cm$^{-2}$) resulting in shallow junctions having a depth essentially equal to that of the epi layer thickness.

The junctions may be included in one or more of an emitter, a back-surface-field (BSF), and/or a front-surface-field (FSF). The FSF may have the same doping type as the substrate or an opposite doping type as the substrate, thus forming a floating junction. The very thin epitaxial layers result in low Auger recombination levels that do not affect the solar cell performance. In addition, due to the high doping concentration in the epi layer(s), a density of minority carriers reaching the substrate surface is reduced, and therefore a modest surface passivation is sufficient to achieve sufficiently low surface recombination levels. The thin epitaxial layers also permit short growth times, which is desirable for high manufacturing throughput.

A built-in potential of a junction (upper limit to open circuit voltage, $V_{oc}$) increases with increasing doping concentration. For example: $E_{fn}-E_i=(kT/q)\cdot\ln(N_D/n_i)-\Delta E_{gn}/2kT$ where $\Delta E_{gn}$ is bandgap narrowing in an n$^+$ region, $E_{fn}$ is the quasi-Fermi energy level for electrons, $E_i$ is the intrinsic energy level, k is the Boltzmann constant, T is temperature (absolute), q is electronic charge, $N_D$ is the concentration of active donor impurities (donor doping levels) and $n_i$ is the intrinsic carrier density. Similarly, $E_i-E_{fp}=(kT/q)\cdot\ln(N_A/n_i)-\Delta E_{gp}/2kT$ where $\Delta_{gp}$ is bandgap narrowing in a p$^+$ region, and $N_A$ is the concentration of acceptor impurities (acceptor doping levels). An upper limit on $V_{oc}$ which is equal to the built-in potential of the junction may be expressed as $E_{fn}-E_{fp}$. If Auger recombination is contained, $V_{oc}$ may be improved accordingly.

Figure 1A:
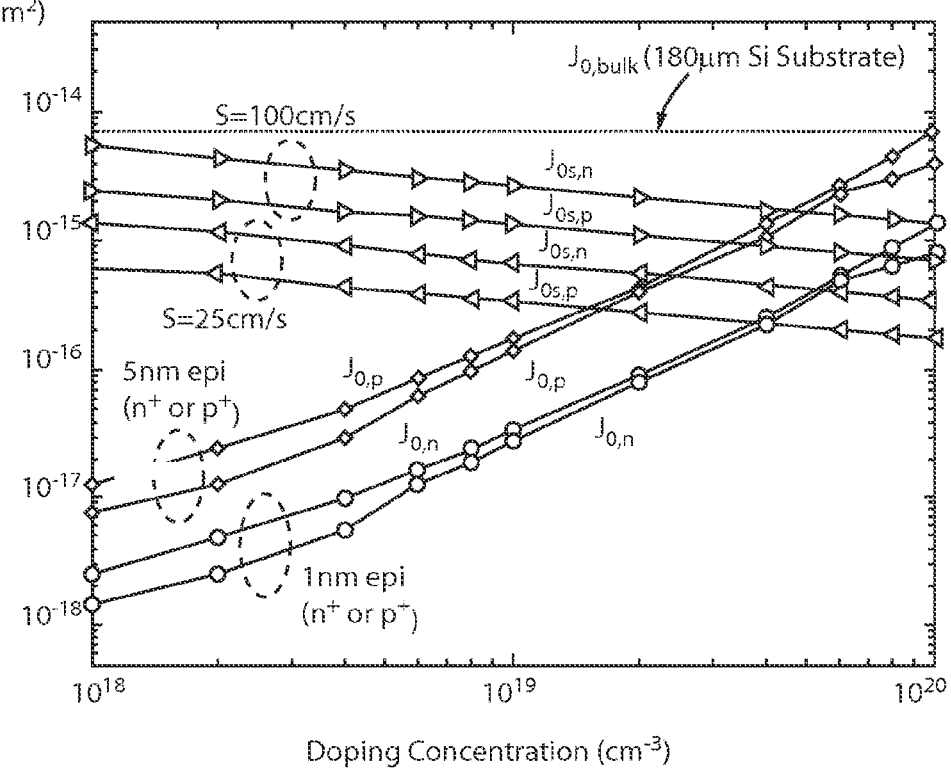
FIG. 1A is a plot of calculated dark currents generated from various sources of recombination in an exemplary solar cell structure comprised of a p-type crystalline Si substrate and thin epitaxial layers of Si grown on the substrate assuming substantially defect-free epitaxial layers.

Recombination sources may include bulk recombination, Auger recombination within the highly doped epitaxial regions and surface recombination. Bulk recombination occurs in a substrate, e.g., a Si substrate. Assuming a p$^-$ Si substrate, bulk recombination current may be expressed as $J_{0,bulk}=q\cdot n_i^2/(N_A+\Delta n)\cdot W_{bulk}/T_{bulk}$ where $\Delta n$ is the number of photo-generated (minority) electrons, $W_{bulk}$ is the substrate thickness and $T_{bulk}$ is the average recombination time of minority electrons in the substrate. Assuming $W_{bulk}$ (substrate thickness)=180 μm, $N_A+\Delta n$ at 1 sun=$10^{16}$ cm$^{-3}$, and $T_{bulk}$=5 ms, the calculated $J_{0,bulk}\approx 7$ fA/cm$^2$ (1 fA=$10^{-15}$ A) as plotted in FIG. 1A. Auger recombination within an n$^+$ epitaxial layer may be expressed as: $J_{0,p}=q\cdot n_i^2/N_D\cdot\exp(\Delta E_{g,n}/kT)\cdot W_N/T_p$ and within p$^+$ epitaxial layer as: $J_{0,n}=q\cdot n_i^2/N_A\cdot\exp(\Delta E_{g,p}/kT)\cdot W_P/T_n$ where $W_N$, $W_P$ are thicknesses of n$^+$ and p$^+$ epitaxial layers, respectively, and $T_p$ and $T_n$ are respective average minority carrier recombination times. The values of $T_p$ and $T_n$ are doping dependent and are known in the art for high-quality (i.e., substantially defect-free) crystalline Si wafers as plotted in FIG. 1B for various doping concentrations. The presence of defects in Si reduces $T_n$ and/or $T_p$; however, a very low dislocation density (e.g., less than $10^5$ cm$^{-2}$) ensures that $T_n$ and $T_p$ in an epitaxially grown Si layer are very close to that of high-quality crystalline Si wafers. Using this assumption, $J_{0,n}$ and $J_{0,p}$ are plotted in FIG. 1A for two exemplary epitaxial layer thicknesses of 1 nm and 5 nm. Surface recombination at the n$^+$ epi surface may be expressed as: $J_{0s,p}=q\cdot n_i^2/N_D\cdot\exp(\Delta E_{g,n}/kT)\cdot S_p$ and at the p$^+$ epi surface: $J_{0s,n}=q\cdot n_i^2/N_A\cdot\exp(\Delta E_{g,p}/kT)\cdot S_n$, where $S_p$ and $S_n$ are surface recombination velocity of minority holes at the surface of the n$^+$ epitaxial layer and surface recombination velocity of minority electrons at the surface of the p$^+$ epitaxial layer, respectively. $J_{0s,p}$ and $J_{0s,n}$ are plotted for two exemplary values of $S_n=S_p=100$ and $S_n=S_p=25$ cm/sec in FIG. 1A.

Figure 1B:
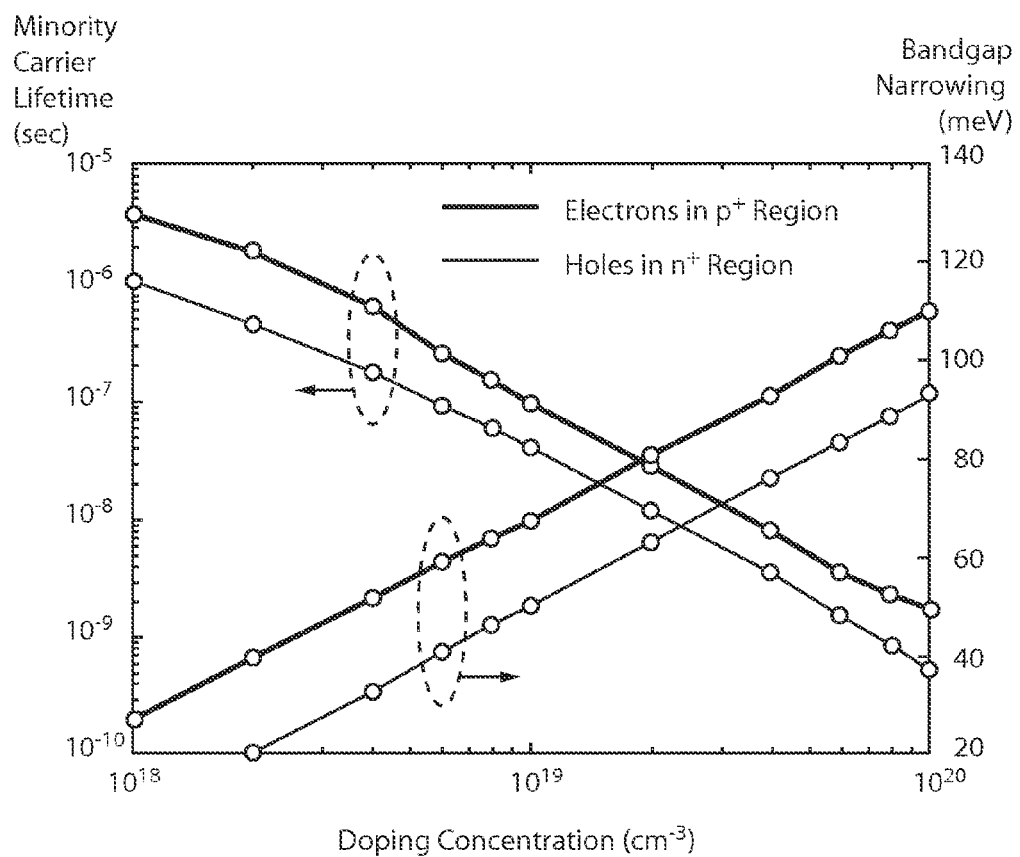
FIG. 1B is a plot of minority carrier lifetime and bandgap narrowing as a function of doping concentration for substantially defect-free crystalline Si material.

As seen in FIG. 1B, for 1-5 nm thick n$^+$ and p$^+$ epitaxial layers, the dark current generated from Auger recombination in the epitaxial layers ($J_{0,p}$ and $J_{0,n}$, respectively) increases with increasing doping concentration; however, it remains lower than the dark current generated in the substrate, $J_{0,bulk}$, even at doping concentrations well above $10^{19}$ cm$^{-3}$. Surface recombination currents $J_{0s,n}$ and $J_{0s,p}$ are also lower than $J_{0,bulk}$ for the given surface recombination velocity values of 25 and 100 cm/s; and decrease as the doping concentration is increased, allowing for higher values of surface recombination velocity that generate dark currents lower than $J_{0,bulk}$.

In accordance with the present principles, by reducing the thickness of p$^+$ and n$^+$ epi layers, Auger recombination in the p$^+$ and n$^+$ epi layers is reduced to be lower than other sources of recombination so as to prevent compromise of $V_{oc}$.

$V_{oc}=kT/q\cdot\ln(J_{optical}/J_0)$, where $J_{optical}$ is the photo-generated current and $J_0$ is sum of all dark currents above. Auger recombination can be contained for thin layers. Effects of surface recombination are reduced by increasing doping concentration in the epi layers (fewer minority carriers can reach the surface), and it becomes easier to passivate the surface. It should be noted that the epitaxial layer thicknesses of 1 nm and 5 nm used for calculation in FIG. 1A refer to the undepleted portion of the epitaxial layer. The depletion region width in $n^+$ epitaxial layer may be expressed as (a similar expression may be used for $p^+$ layers), $W_{D,n}=(2\in_{Si}\cdot(V_{bi}-V_{bias})\cdot(N_A/N_D)/(N_A+N_D)/q)^{1/2}$ where $\in_{Si}$ is the dielectric constant of Si, $V_{bias}$ is the bias voltage (e.g., 0 and $V_{oc}$ at short circuit and open circuit conditions, respectively) and $V_{bi}$ is the built-in potential which may be expressed as $V_{bi}=kT/q\cdot\ln(N_A\cdot N_D/ni^2)-q\cdot dE_{g,p}/kT$. The calculated depletion region width $W_{D,n}$ for $V_{bias}=0$ and $V_{bias}=725$ mV are ~3 nm and ~1 nm at $N_D=10^{18}$ cm$^{-3}$. However, $W_{D,n}$ decreases exponentially with $N_D$ and reduce to ~0.3 nm and ~0.1 nm at $N_D=10^{19}$ cm$^{-3}$ and ~0.03 nm and ~0.01 nm at $N_D=10^{20}$ cm$^{-3}$ for the mentioned bias conditions. Therefore, the depleted portion of the epitaxial layer is negligible at high doping concentrations of interest.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound, such as, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention may be part of a tandem (multi-junction) structure. The tandem structure may include cells, which will be described in terms of a particular material. Each cell includes a p-doped layer, an n-doped layer and perhaps an undoped intrinsic layer.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 2:
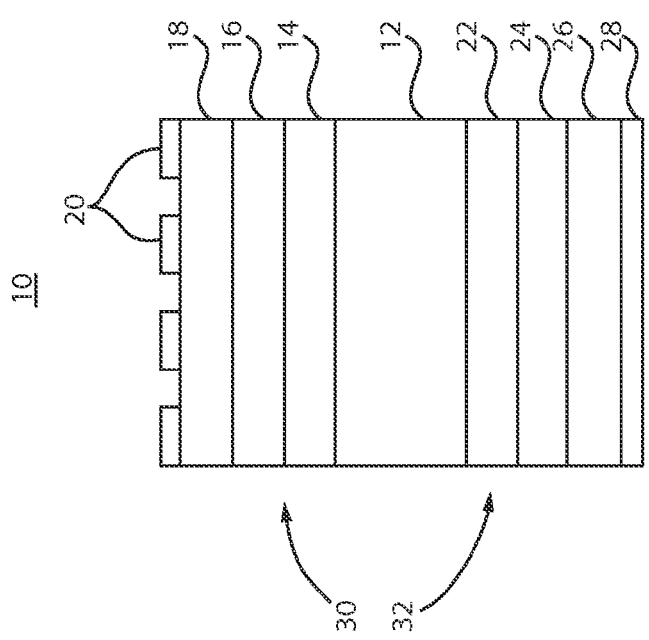
FIG. 2 is a cross-sectional view of a monofacial photovoltaic device having shallow junctions formed by thin epitaxially grown layers configured to reduce Auger recombination in accordance with the present principles.

Referring again to the drawings in which like numerals represent the same or similar elements and initially to FIG. 2, an illustrative structure of a photovoltaic device 10 with a substrate 12 is shown. The substrate 12 preferably includes silicon and may be single-crystalline (c-Si) or multi-crystalline Si. The substrate 12 includes an emitter or front contact and a back contact. The word "contact" is employed to refer to the structure connected to the substrate 12, which may include an emitter/front contact or a back contact. Since these contacts also include conductive contacts as well, to prevent confusion, the contacts will be referred to as front side 30 and back side 32.

In accordance with the present principles, the front side 30 of the substrate 12 includes an epitaxially grown junction 14, which includes doping above $10^{19}$ cm$^{-3}$. The junction 14 includes thin epitaxial layers to minimize Auger recombination. The junction 14 may include monocrystalline Si. The doped epitaxial layer 14 includes doping $>10^{19}$ cm$^{-3}$, with $>5 \times 10^{19}$ cm$^{-3}$ being more preferable. The doped epitaxial layer 14 has a thickness of less than 10 nm, with less than 5 nm being preferred. A passivation layer 16 is formed on the epitaxial layer 14 to allow carrier transport through tunneling, diffusion, and/or other transport mechanisms.

A transparent conductive material or layer 18 such as a transparent conductive oxide (TCO) is formed to reduce lateral resistance for carrier collection at the electrodes. Examples of the transparent conductive layer 18 include but are not limited to indium-tin-oxide (ITO) and aluminum-doped zinc-oxide (ZnO:Al or AZO). The TCO layer 18 may serve as an anti-reflection coating in the front side 30. Metal fingers 32 are patterned on the transparent conductive layer 18.

In accordance with the present principles, the back side 32 of the substrate 12 includes an epitaxially grown junction 22, which includes doping above $10^{19}$ cm$^{-3}$. The junction 22 includes thin epitaxial layers to minimize Auger recombination. The junction 22 may include monocrystalline Si. The doped epitaxial layer 22 includes doping $>10^{19}$ cm$^{-3}$, with $>5 \times 10^{19}$ cm$^{-3}$ being more preferable. The doped epitaxial layer 22 has a thickness of less than 10 nm, with less than 5 nm being preferred. A passivation layer 24 is formed on the epitaxial layer 22 to allow carrier transport through tunneling, diffusion, and/or other transport mechanisms.

A transparent conductive material or layer 26 such as a transparent conductive oxide (TCO) is formed to reduce lateral resistance for carrier collection at the electrodes. Examples of the transparent conductive layer 26 include but are not limited to indium-tin-oxide (ITO) and aluminum-doped zinc-oxide (ZnO:Al or AZO). The TCO layer 26 may serve as a back-reflector in combination with a reflective metal contact 28 employed in a monofacial structure (e.g., receiving light from one side (the front side 30).

In useful embodiments, the passivation layers 16 and 24 may include hydrogenated amorphous Si (a-Si:H), hydrogenated nano-crystalline Si (nc-Si:H), or combinations thereof. The passivation layers 16 and 24 with Si:H are either intrinsic or have a same doping type as that of the underlying epitaxial layer 14 and 22, respectively. The passivation layers 16 and 24 with Si:H may include C, Ge, Cl, F, D (deuterium), O, N, or combinations thereof. The passivation layers 16 and 24 may include thicknesses of less than about 20 nm, with less than about 10 nm being preferable.

Other passivation layers may be employed in addition to or instead of layers 16 and 24. The other passivation layers may include but are not limited to thin layers of high-k dielectrics (e.g., less than 3 nm) such as aluminum oxide, hafnium oxide, tantalum oxide, etc.

If the substrate 12 includes p type doping, then epitaxial layer 14 is n+ doped and epitaxial layer 22 is p+ doped. If the substrate 12 includes n type doping, then epitaxial layer 14 is p+ doped and epitaxial layer 22 is n+ doped.

While substrate 12 and epitaxial layers 14 and 22 are illustratively described to include Si, semiconducting material(s) for forming these structures may also include Ge, SiGe$_x$, SiC$_x$, etc. or combinations of these materials and may or may not contain hydrogen. The passivation layers 16 and 24 may include amorphous, nanocrystalline, microcrystalline or polycrystalline films(s) of Si, Ge, SiGe$_x$, SiC$_x$, SiO$_x$, SiN$_x$, or combinations of these materials and may or may not contain hydrogen and may or may not contain fluorine or deuterium. The reflective metal contact 28 may include a metal such as aluminum, silver, tungsten, etc.

In a preferred embodiment, the substrate 12 is single-crystalline and may be textured by random pyramids and/or inverted pyramids, e.g., by using an alkaline solution for etching to reduce reflection from the surface and improve light-trapping in the substrate 12. In some embodiments, rounding may be performed using an isotropic etch solution such as CP$_4$ or TMAH to improve the epitaxial quality at a tip and/or bottom of the pyramids.

The epitaxial layers 14 and 22 are grown preferably by rapid thermal chemical vapor deposition (RTCVD) using a Si precursor including but not limited to silane, disilane, or dichlorosilane. Dopant gases may include but are not limited to phosphine and arsine for n+ doping, and diborane or tetramethylborane (TMB) for p+ doping. Other chemical vapor deposition (CVD) methods, such as ultra-high vacuum CVD (UHCVD) or low pressure CVD (LPCVD) may be used as well for forming epitaxial layers 14 and 22. Growth (substrate) temperatures may be in the range of about 500° C. to about 1000° C. Under these growth conditions, the hydrogen content of the epitaxial layer is below 0.1% atomic and more preferably below 0.01% atomic. In addition, other methods such as molecular beam epitaxy (MBE) may also be employed for epitaxial growth for forming epitaxial layers 14 and 22.

In particularly useful embodiments, epitaxially grown doped layers 14 and 22 have a doping concentration of $10^{19}$ cm$^{-3}$ or greater, a dislocation density of $10^5$ cm$^{-2}$ or smaller, a hydrogen content of 0.1 atomic percent or smaller, and a thickness configured to reduce Auger recombination in the epitaxially grown doped layer, e.g., less than 10 nm and more preferably less than 5 nm.

The passivation layers 16 and 24 may be grown by plasma-enhanced CVD (PECVD) at temperatures in the range of between about 150° C. to about 250° C., although higher or lower temperatures are also possible. Other techniques such as hot-wire CVD or remote-plasma CVD may be also employed. Gas precursors may include but are not limited to silane, disilane, or dichlorosilane, and may or may not be mixed by hydrogen. Dopant gases include but are not limited to phosphine and arsine for n+ doping, and diborane or TMB for p+ layers.

In particularly useful embodiments, the substrate 12 is comprised of single-crystalline Si and may be either n-type or p-type. An emitter junction has the opposite doping type as the substrate 12, while a back-surface-field (BSF) junction has the same doping type as the substrate 12. In a mono-facial structure, sunlight enters from the front side 30. The emitter side is preferably the front side 30. However, if the diffusion length of minority carriers in the bulk is much larger than substrate thickness, the BSF side may be used as the front side 30 with negligible efficiency drop due to bulk recombination.

A p-type substrate 12 may include an n-type epi layer 14 on the front (emitter) side 30. The passivation layer 16 may also be n-type. An n-type substrate 12 may include a p-type epi layer 22 on the front (emitter) side. The passivation layer 24 may also be p-type on the front side 30. In a bifacial structure, light enters from both sides (with metal grids 20 optionally provided for both sides) as depicted in FIG. 2.

Figure 3:
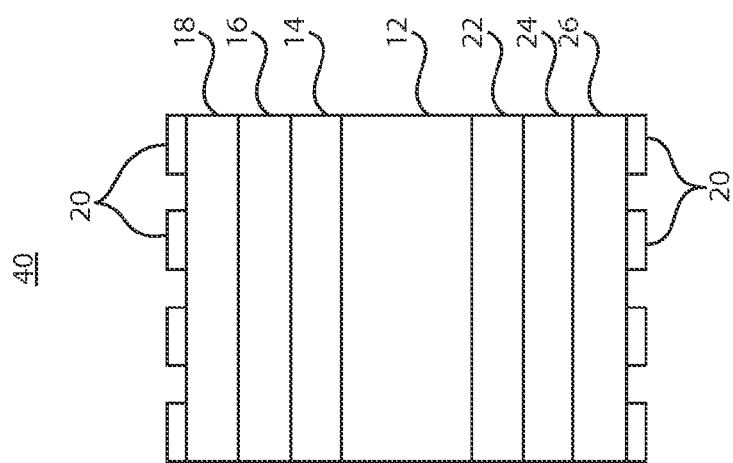
FIG. 3 is a cross-sectional view of a bifacial photovoltaic device having shallow junctions formed by thin epitaxially grown layers configured to reduce Auger recombination in accordance with the present principles.

Referring to FIG. 3, another structure 40 is shown in accordance with another embodiment. The structure 40 includes a bifacial photovoltaic device 40 having metal fingers 20 formed on both the front side 30 and the back side 32 of the device 40. The bifacial device receives light from both the front side 30 and the back side 32 of the device 40.

The present principles can be extended to other photovoltaic device designs and structures. In one embodiment, the present principles may be employed in interdigitated back contact (IBC) photovoltaic devices. IBC solar cells are of interest for eliminating the shadowing loss from a front metal grid. High doping levels are desired for increasing the splitting of quasi-Fermi levels and thus improving the open circuit voltage of the solar cell. In IBC solar cells, the emitter and the BSF junctions are formed on the backside of the cell, therefore there is no shadowing loss due to metal grid presence on the front side.

Figure 4:
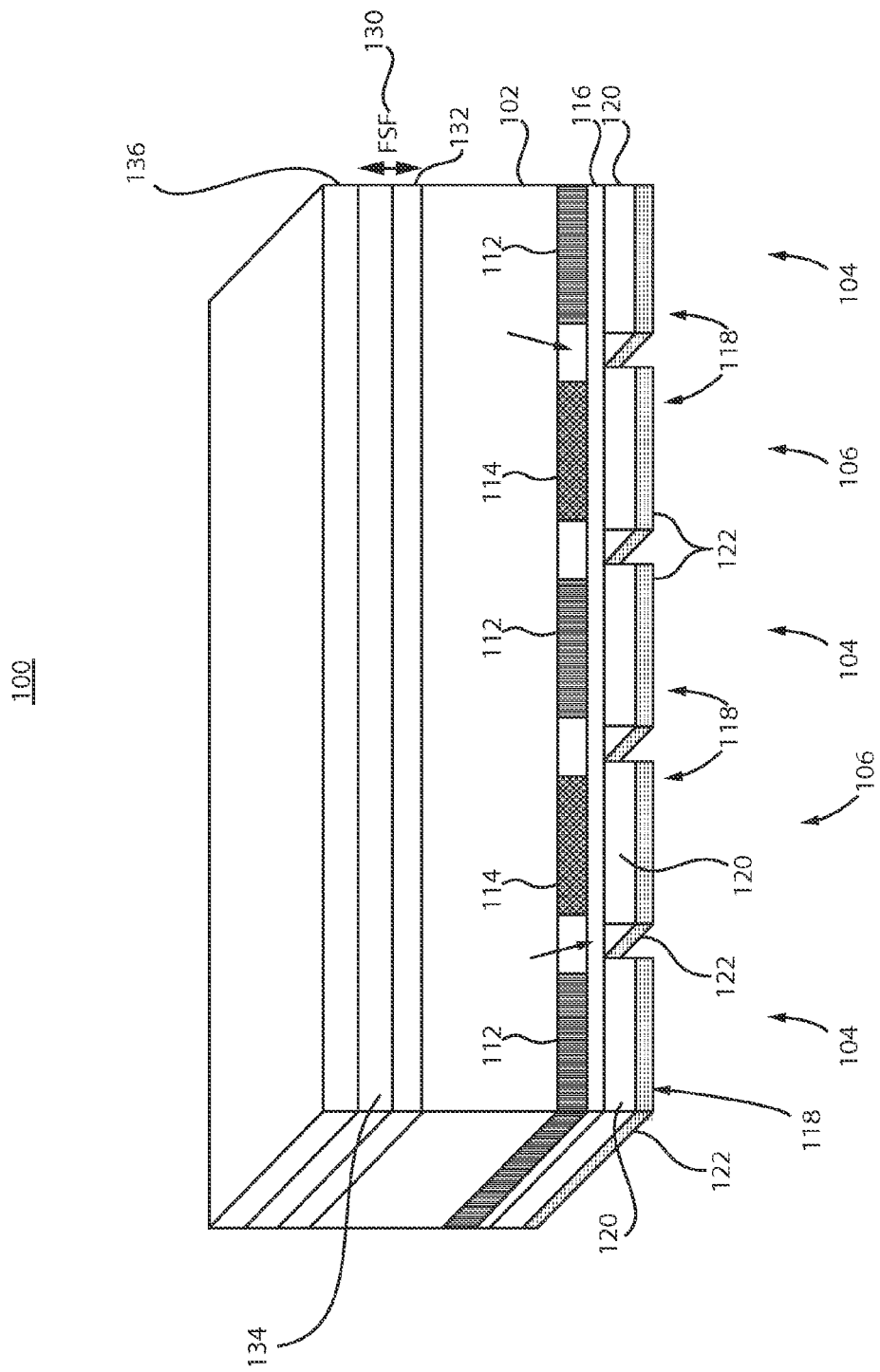
FIG. 4 is a perspective view of an interdigitated back contact photovoltaic cell having shallow junctions formed by thin epitaxially grown layers configured to reduce Auger recombination in accordance with the present principles.

Referring to FIG. 4, a cross-section of an interdigitated back contact (IBC) photovoltaic cell 100 is shown in accordance with one illustrative embodiment. Cell 100 includes an n-type crystalline substrate 102. In a particularly useful embodiment, the substrate includes crystalline Si (c-Si). The substrate 102 may be single-crystalline to multi-crystalline. In preferred embodiments, the substrate 102 is single-crystalline and textured by random pyramids or inverted pyramids, e.g., by using an alkaline solution to reduce reflection from the (front) surface and improve light-trapping in the substrate 102. In some embodiments, only the front side is textured. In some embodiments, rounding may be performed using an isotropic etch solution such as $CP_4$ or TMAH to improve the epitaxial quality at the top and/or bottom of the pyramids formed on the surface of the substrate 102.

The cell 100 includes emitter contacts or junctions 104 and back surface field (BSF) contacts or junctions 106. The junctions 104 and 106 are formed by doped epitaxial layers 112 and 114, which are respectively p+ doped and n+ doped. The doped layers 112 and 114 may include thin layers preferably less than about 5 nm to reduce or eliminate Auger recombination. A passivation layer 116 is formed over and in between the doped layers 112 and 114. In particularly useful embodiments, epitaxially grown doped layers 112 and 114 have a doping concentration of $10^{19}$ cm$^{-3}$ or greater, a dislocation density of $10^5$ cm$^{-2}$ or smaller, a hydrogen content of 0.1 atomic percent or smaller, and a thickness configured to reduce Auger recombination in the epitaxially grown doped layer, e.g., less than 10 nm and more preferably less than 5 nm.

An electrode 118 may include a transparent conductive oxide (TCO) material 120 (e.g., indium-tin-oxide, aluminum doped zinc-oxide, or other materials). The TCO material 120 of electrode 118 may serve to improve reflection from a back surface metal 122, such as Ag, W, etc.

A front surface field (FSF) junction 130 is formed on a side of the substrate 102 opposite the emitter junctions 104 and BSF junctions 106. The FSF junction 110 includes thin continuous layers. Note that light (e.g., sunlight) enters the cell 100 from the front side, and since all the metallization is formed on the back side of the cell 100, there is no shadowing due to the presence of a metal grid. Note also that thinner layers are employed for layers of the FSF junction 130 as compared to the back side of the cell 100 to reduce absorption loss.

The FSF junction 130 includes an n+ or p+ doped epitaxially grown crystalline layer 132 formed on the n-type substrate 102. The crystalline layer 132 may be grown epitaxially using the same techniques described for the emitter and back surface field contacts and is sufficiently thin to reduce Auger recombination. The layer 132 is used to passivate the front surface of the c-Si substrate 102. Since the layer 132 is crystalline, absorption loss in the FSF stack is reduced. A noncrystalline passivation layer 134 is formed on the crystalline layer 132 to passivate the front surface of the crystalline layer 132. The passivation layer 134 may include a same dopant conductivity as layer 132. Both layers 132 and 134 may have a same dopant conductivity as that of the substrate 102 or an opposite dopant conductivity as that of the substrate 102. The term "noncrystalline" indicates that the material is amorphous, nano-crystalline or micro-crystalline.

In particularly useful embodiments, layer 132 has a doping concentration of $10^{19}$ cm$^{-3}$ or greater, a dislocation density of $10^5$ cm$^{-2}$ or smaller, a hydrogen content of 0.1 atomic percent or smaller, and a thickness configured to reduce Auger recombination in the epitaxially grown doped layer, e.g., less than 10 nm and more preferably less than 5 nm.

An anti-reflection coating 136 may be formed on the passivation layer 134. The anti-reflection coating 136 may include hydrogenated amorphous silicon nitride (a-SiN$_x$:H), hydrogenated amorphous silicon oxide (a-SiO$_x$:H), hydrogenated amorphous silicon oxynitirde (a-SiN$_x$O$_y$:H), amorphous aluminum oxide, amorphous zinc-oxide, amorphous tin-oxide, or combinations (composition or multi-layer) thereof. The ARC layer 136 does not need to be conductive and may be insulating (optical transparency is needed); however, a transparent conductive material such as TCO (including but not limited to indium-tin-oxide, Al-doped zinc-oxide, etc.) may be used to serve as the ARC layer 136 as well.

Thin highly doped epitaxial regions 112 and 114 are grown selectively to form the emitter 104, BSF 106 and/or FSF junctions 130. The FSF 130 is optional (but preferred). The very thin (preferably less than 5 nm) epitaxial layers 112, 114, 132 prevent excessive Auger recombination. Preferably thin passivation layers 116, 134 are used to passivate the surface. If desired, localized metal contacts may also be employed as well (similar to conventional devices) (not shown). The net recombination will be lower as compared to conventional devices, as the highly doped epi regions 112, 114, 130 more effectively shield the minority carriers from the surface of the substrate 102.

In particularly useful embodiments, doped epi layers 112, 114 and 132 have doping greater than $10^{19}$ cm$^{-3}$, with greater than $5\times10^{19}$ cm$^{-3}$ being preferred. Doped epi layers 112, 114 and 132 have thicknesses less than about 10 nm, with less than about 5 nm being preferred. The epitaxial layers 112, 114 and 132 are preferably grown by rapid thermal chemical vapor deposition (RT CVD) using a Si precursor including but not limited to silane, disilane, or dichlorosilane. Dopant gases include but are not limited to phosphine and arsine for n$^+$ doping, and diborane or tetramethylborane (TMB) for p$^+$ layer. Other CVD methods such as LPCVD or UHVCVD may be used as well. The growth temperature may be in the range of between about 500 and about 1000° C. In addition, other methods such as molecular beam epitaxy (MBE), may also be employed for epitaxial growth.

The passivation layers 116 and 134 are thin to allow carrier transport through tunneling, diffusion, and/or other transport mechanisms. In preferred embodiments, the thin passivation layers 116 and 134 include hydrogenated amorphous Si (a-Si: H), hydrogenated nano-crystalline Si (nc-Si:H), or combinations thereof. The passivation layers 116 and 134 may be intrinsic or have a same doping type as that of the underlying epi layer (112, 114, 132). The passivation layers 116 and 134 with Si:H may include C, Ge, Cl, F, D (deuterium), O, N, or combinations thereof. The passivation layers 116 and 134 with Si:H may include thicknesses less than 20 nm, with less than 10 nm being preferred. Other passivation layers may include but not are limited to thin layers of high-k dielectrics (<3 nm) such as aluminum oxide, hafnium oxide, tantalum oxide, etc.

The a/nc-Si:H layers 116 and 134 may be grown by plasma-enhanced CVD (PECVD) at temperatures in the range of about 150° C. to about 250° C., although higher or lower temperatures are also possible. Other techniques such as hot-wire CVD or remote-plasma CVD may be also employed. Gas precursors include but are not limited to silane, disilane, or dichlorosilane, and may or may not be mixed by hydrogen. Dopant gases may include but are not limited to phosphine and arsine for $n^+$ doping, and diborane or TMB for $p^+$ layers.

The TCO 120 is optionally employed as a barrier against metal reaction with the thin passivation layer 116. The TCO layer 120 may also serve as a back-reflector in combination with the reflective metal 122 such as silver in the back. Examples of TCO 120 include but are not limited to indium-tin-oxide and aluminum-doped zinc-oxide.

Figure 5:
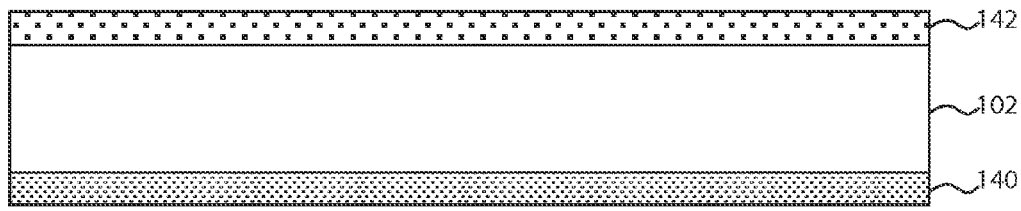
FIG. 5 is a cross-sectional view of a crystalline substrate having passivation/dielectric layers formed thereon in accordance with the present principles.

Referring to FIG. 5, a method for fabrication of an IBC photovoltaic device is illustratively shown in accordance with one illustrative embodiment. The substrate 102 is passivated with oxide, nitride, or other insulating materials (various techniques known in the art may be used) to form passivation layers 140 and 142. The passivation layers 140 and 142 may be formed by a CVD method, a PECVD method, a thermal growth method, etc.

Figure 6:
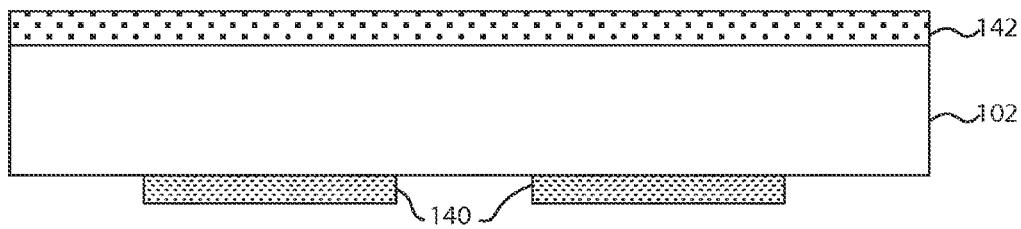
FIG. 6 is a cross-sectional view of the crystalline substrate of FIG. 5 having one of the passivation/dielectric layers patterned thereon in accordance with the present principles.

Referring to FIG. 6, the passivation layer 140 is patterned on a backside of the substrate 102, e.g., by lithography.

Figure 7:
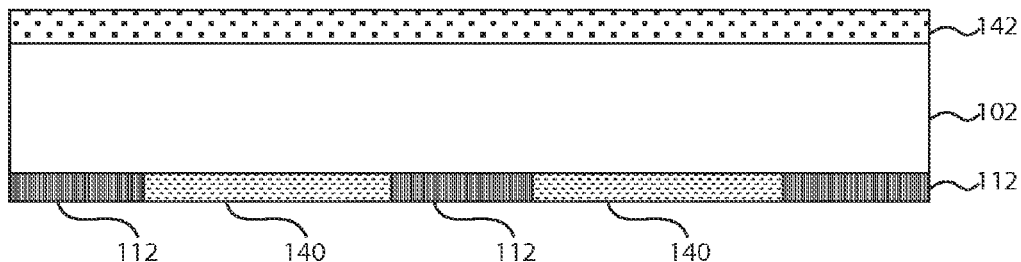
FIG. 7 is a cross-sectional view of the crystalline substrate of FIG. 6 having doped epitaxial layers selectively grown on the substrate in accordance with the present principles.

Referring to FIG. 7, a first doped epi layer 112 is grown selectively on exposed portions of the substrate 102 between portions of the passivation layer 140.

Figure 8:
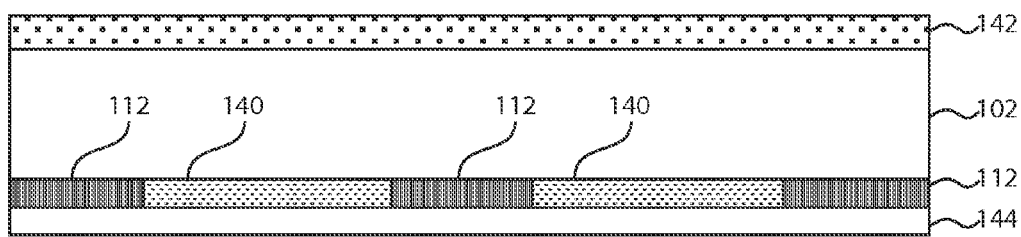
FIG. 8 is a cross-sectional view of the crystalline substrate of FIG. 7 having another passivation layer formed over the doped epitaxial layers in accordance with the present principles.

Referring to FIG. 8, a second passivation layer 144 is formed on the backside over the first doped epi layer 112 and passivation layer 140. Any suitable deposition technique may be employed (e.g., CVD, PECVD, etc.).

Figure 9:
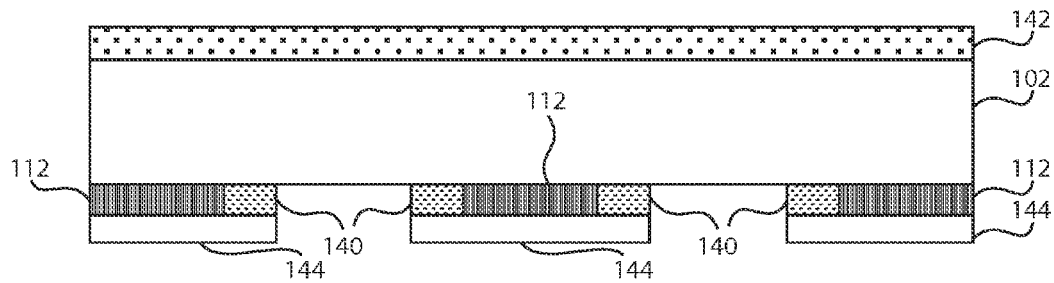
FIG. 9 is a cross-sectional view of the crystalline substrate of FIG. 8 having the other passivation layer patterned over the doped epitaxial layers in accordance with the present principles.

Referring to FIG. 9, two passivation layers 140, 144 are patterned, e.g., using a single lithography step. This exposes portions of the substrate 102 in between the epi layers 112.

Figure 10:
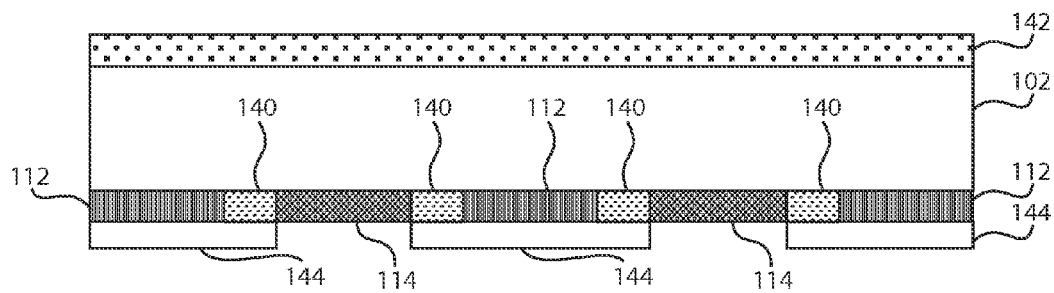
FIG. 10 is a cross-sectional view of the crystalline substrate of FIG. 9 having other doped epitaxial layers selectively grown on the substrate in accordance with the present principles.

Referring to FIG. 10, the second doped layer 114 is grown selectively on the substrate 102. The layers 112 and 114 have different dopant conductivities.

Figure 11:
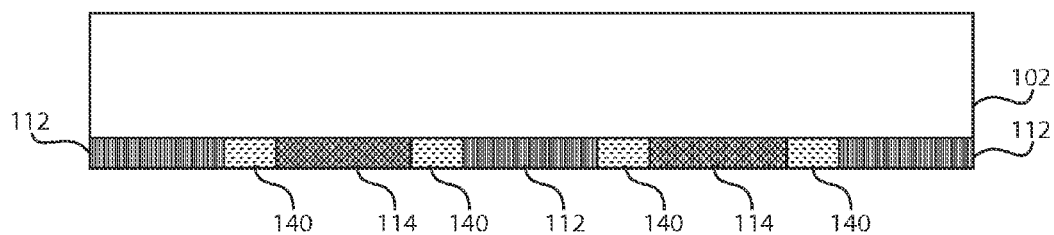
FIG. 11 is a cross-sectional view of the crystalline substrate of FIG. 10 having the passivation layers removed from the doped epitaxial layers and the substrate in accordance with the present principles.

Referring to FIG. 11, the passivation layers 142 and 144 are removed from the substrate 102. This may include the use of a wet or dry etch process, etc. or combinations of processes.

It is preferable that the second passivation layer 144 can be etched selectively or has a higher etch rate than the first passivation layer 140. This can be done through various methods. For example, by using a lower growth/deposition temperature, lower plasma power density (if PECVD is used), higher OH content, lower Si content, etc. or combinations thereof for the second silicon dioxide, nitride or oxynitiride layer. It is also possible to achieve selectivity or etch rate difference by using different dielectric layers such as silicon dioxide, silicon nitride, aluminum oxide, titanium oxide, etc.

Figure 12:
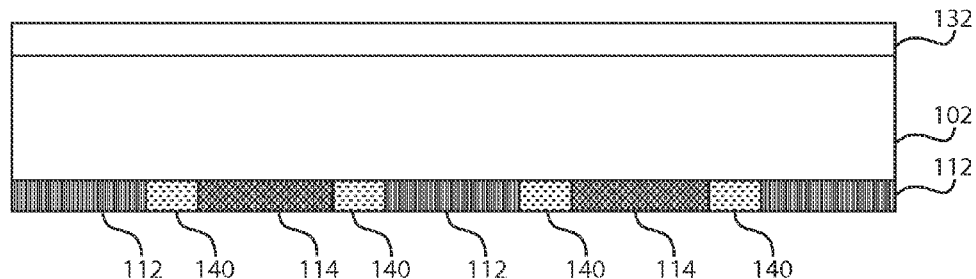
FIG. 12 is a cross-sectional view of the crystalline substrate of FIG. 11 having a doped epitaxial layer formed on a front surface of the substrate in accordance with the present principles.

Referring to FIG. 12, the doped epitaxial layer 132 for FSF is formed by blanket growth of a doped epitaxial layer. For example, an RTCVD process may be employed. The layer 132 may include n+ or p+ dopants.

Figure 13:
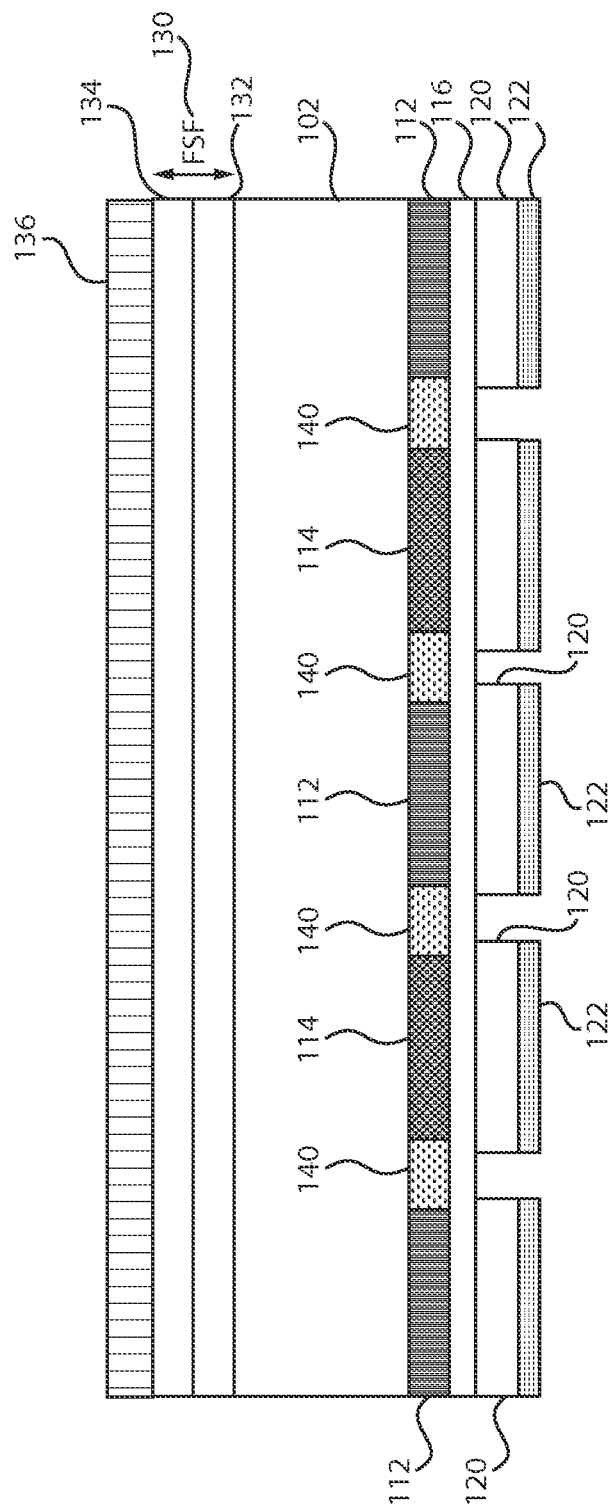
FIG. 13 is a cross-sectional view of the crystalline substrate of FIG. 12 having a passivation layer and anti-reflection coating formed on the front side doped epitaxial layer, showing a single intrinsic passivation layer and transparent and metal electrode layers patterned in accordance with the present principles.

Referring to FIG. 13, the backside is passivated with passivation layer 116. In this embodiment, the passivation layer includes a blanket deposited intrinsic a-Si:H or nc-Si:H layer 116. The intrinsic passivation layer 116 covers both epi layers 112 and 114. This layer 116 may include C, Ge, Cl, F, D (deuterium), O, N, or combinations thereof. This layer 116 has a thickness below 20 nm with thicknesses below 10 nm being preferred. Indium-tin-oxide (ITO), aluminum-doped zinc-oxide (ZnO:Al) or other transparent conductive materials may be deposited and patterned to form transparent portions 120 of electrodes. A thickness of the portions may be in the range of 50-250 nm, but thinner or thicker layers may be employed as well.

A reflective metal 122 such as silver may be formed using various techniques such as screen printing. However, other metals such as copper, tungsten, etc. may be also employed. Transparent portions 120 may be patterned as-deposited, e.g., using a shadow mask, or patterned, e.g., by wet etching using the metal 122 as a hard mask, or using the same mask used for patterning the metal 122 (if the metal 122 is patterned by lithography). A similar a/nc-Si:H based passivation layer 134 (intrinsic or having the same conductivity as the front epi layer 132) is used to passivate the front side.

Figure 14:
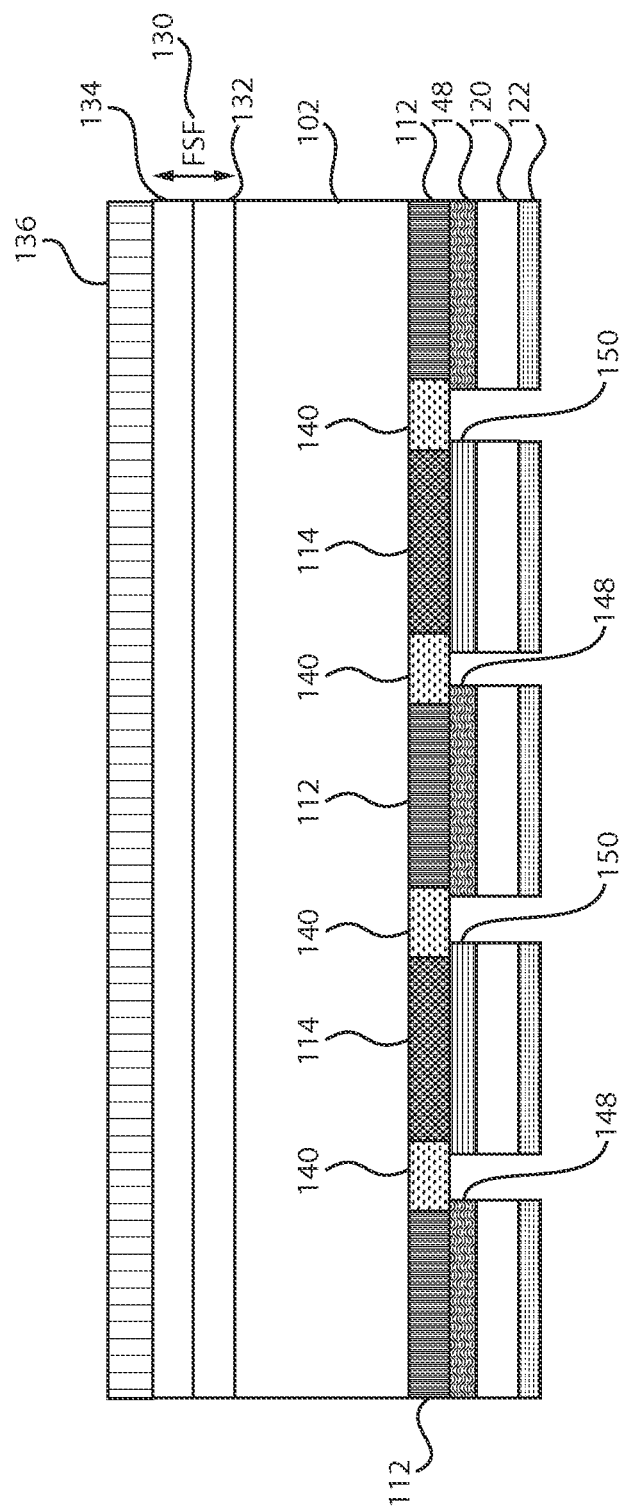
FIG. 14 is a cross-sectional view of the crystalline substrate of FIG. 12 having a passivation layer and anti-reflection coating formed on the front side doped epitaxial layer, showing separately doped passivation layer regions (corresponding to dopant types of the doped epitaxial layers in contact therewith), and transparent and metal electrode layers patterned in accordance with the present principles.

Referring to FIG. 14, in another embodiment, the backside is passivated by a patterned passivation layer (e.g., a-Si:H or nc-Si:H) having portions 148 and 150 having a same conductivity as the underlying epi layers 112 and 114, respectively. These layers 148, 150 may include C, Ge, Cl, F, D (deuterium), O, N, or combinations thereof. These layers 148, 150 have a thickness below 20 nm with thicknesses below 10 nm being preferred.

In an exemplary process, the first doped passivation layer (e.g., a or nc-Si:H) 148 is deposited over the epi layers 112 and 114, followed by the formation of a first set of transparent conductive portions 120 and/or metal regions 112 over the passivation layer 148 of the first conductivity type ($n^+$ epi or $p^+$ epi regions) and the doped epi regions 112, 114. The transparent conductor 120 and/or the transparent conductor 120 and metal layers 122 are patterned and used as a mask to pattern the first doped a/nc-Si:H layer 148. Then, the second doped passivation layer 150 (e.g., a or nc-Si:H) is deposited, followed by the transparent conductor 120 and/or transparent conductor 120 with metal electrodes 122 patterned over the doped epi regions 114 of the second conductivity type. The second set of patterned transparent conductor 120 and/or transparent conductor 120 with metal electrodes 122 is then used as a mask to pattern the second doped passivation layer (e.g., a or nc-Si:H) as shown in FIG. 14.

Figure 15:
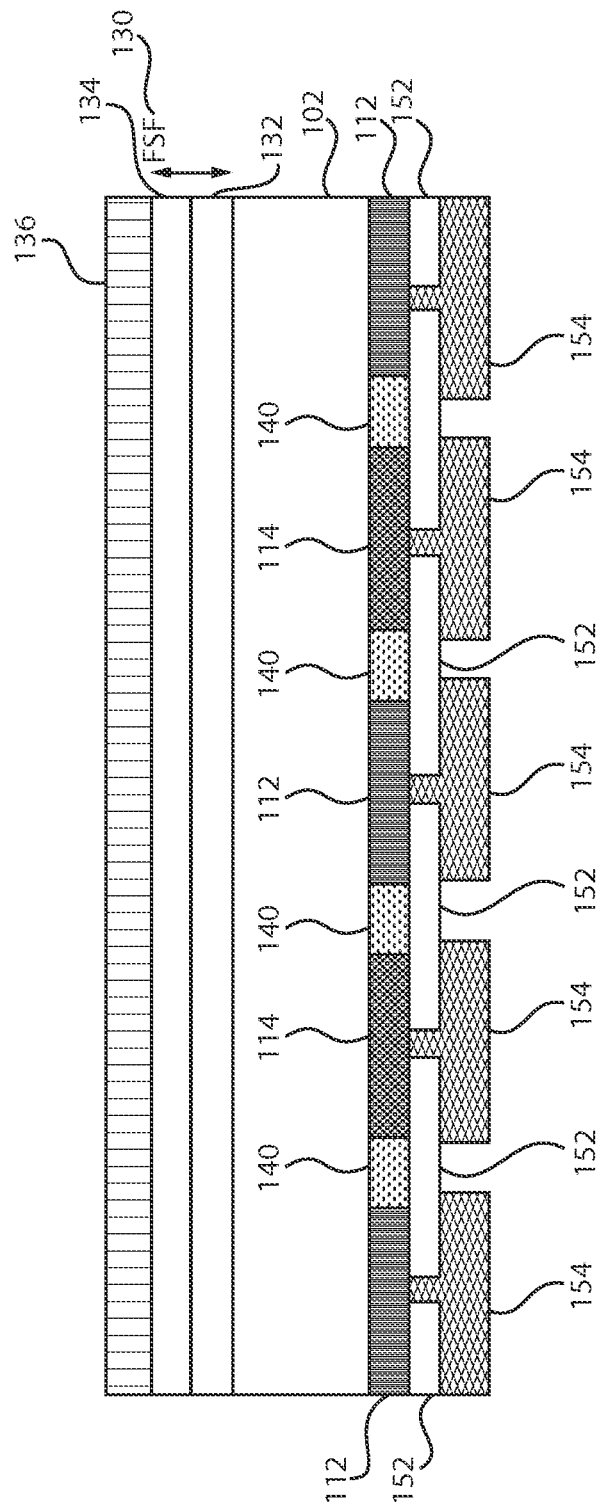
FIG. 15 is a cross-sectional view of the crystalline substrate of FIG. 12 having a passivation layer and anti-reflection coating formed on the front side doped epitaxial layer, showing a single intrinsic passivation layer with gaps, and metal electrode layers filling in the gaps to contact underlying epitaxial grown doped layers in accordance with the present principles.

Referring to FIG. 15, the backside is passivated by localized contacts 154. A passivation layer 152 may be formed over the epi layers 112 and 114. The passivation layer 152 may include $SiO_2$, $Si_3N_4$, a-Si:H, a-$SiO_x$:H, a-$SiN_x$:H, etc. The passivation layer 152 is opened up to expose the epi layers 112, 114. An electrode material 154, such as silver, copper, tungsten or a transparent material, such as indium tin oxide (ITO), aluminum doped zinc oxide (AZO), etc. is deposited in the openings in the passivation layer 152 to make contact with the underlying epi layers 112 and 114. Various materials may be employed to form the passivation layer 152. Examples include but are not limited to silicon dioxide, silicon nitride, hydrogenated amorphous silicon nitride, hydrogenated amorphous silicon oxide, hydrogenated amorphous or nano-crystalline silicon, and combinations thereof. The thickness of the passivation layer 152 may be in the range of 50-250 nm although thicker or thinner layers may be used.

In all embodiments illustrated throughout this disclosure, the substrate 102 may be either n-type or p-type. The emitter junction has a doping type opposite to that of the substrate, while the BSF junction has the same conductivity type as the substrate 102. The FSF junction 130 (if present) may have the same or opposite conductivity as the substrate. The FSF junction 130 is optional (but preferred) and therefore part or all of it may be omitted.

The thickness of the passivation layers may be equal, smaller or greater than that of the epi layers (112, 114). The thicknesses of the epi layers 112, 114 may be the same or different. The widths of the p+ and n+ regions 112, 114 in the back may be the same or different. If boron and phosphorous are employed for in-situ doping of the epi layers 112, 114, it is preferable to grow the p+ regions first. This is because boron has a smaller diffusivity than phosphorous and therefore widening of the p+ junction during n+ growth is smaller.

It should also be noted that, in some alternative implementations, the functions noted in the FIGS. may occur out of the order noted by the FIGS. For example, two figures shown in succession may, in fact, be executed substantially concurrently, or may sometimes be executed in the reverse order, depending upon the functionality involved.

Having described preferred embodiments shallow junction photovoltaic devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a photovoltaic device, comprising:
    forming a first contact on a crystalline substrate, the first contact being formed by:
        epitaxially growing a first doped layer having a doping concentration of $10^{19}$ cm$^{-3}$ or greater, a dislocation density of $10^5$ cm$^{-2}$ or smaller, a hydrogen content of 0.1 atomic percent or smaller, and a thickness configured to reduce Auger recombination in the epitaxially grown doped layer; and
        forming a first passivation layer on the first doped layer; and
    forming a second contact on the crystalline substrate on a side opposite the first contact, the second contact being formed by:
        epitaxially growing a second doped layer having a doping concentration of $10^{19}$ cm$^{-3}$ or greater, a dislocation density of $10^5$ cm$^{-2}$ or smaller, a hydrogen content of 0.1 atomic percent or smaller and a thickness configured to reduce Auger recombination in the second epitaxially grown doped layer; and
        forming a second passivation layer on the second doped layer.

2. The method as recited in claim 1, wherein the crystalline substrate includes Si and the first and second doped layers include epitaxially grown Si.

3. The method as recited in claim 1, wherein the crystalline substrate includes a dopant type and the first contact includes a same dopant type as the substrate and the second contact includes an opposite dopant type from the substrate.

4. The method as recited in claim 1, further comprising forming a transparent conductor over the first and second passivation layers.

5. The method as recited in claim 4, further comprising forming one of a metal grid and a metal reflector over the transparent conductor for the first contact and the second contact.

6. The method as recited in claim 1, wherein the first doped layer and the second doped layer include a thickness of less than 10 nm.

7. The method as recited in claim 1, wherein the first passivation layer and the second passivation layer include a thickness of less than 15 nm.

8. The method as recited in claim 1, wherein the first passivation layer and the second passivation layer include one of an intrinsic layer and a layer doped with a same dopant type as the doped layer in contact therewith.

9. The method as recited in claim 1, wherein the first doped layer and the second doped layer are grown by rapid thermal chemical vapor deposition at substrate temperatures in the range of between about 500 to about 1000° C.

10. The method as recited in claim 1, wherein the first doped crystalline layer is in direct contact with the crystalline substrate.

11. The method as recited in claim 1, wherein the second doped crystalline layer is in direct contact with the crystalline substrate.

* * * * *